United States Patent
Liu et al.

(10) Patent No.: US 9,136,393 B2
(45) Date of Patent: Sep. 15, 2015

(54) HK EMBODIED FLASH MEMORY AND METHODS OF FORMING THE SAME

(71) Applicant: Taiwan Semiconductor Manufacturing Company, Ltd., Hsin-Chu (TW)

(72) Inventors: Ming-Chyi Liu, Hsin-Chu (TW);
Wei-Hang Huang, Kaohsiung (TW);
Yu-Hsing Chang, Taipei (TW);
Chang-Ming Wu, New Taipei (TW);
Wei Cheng Wu, Zhubei (TW);
Shih-Chang Liu, Alian Township (TW);
Harry-Hak-Lay Chuang, Singapore (SG); Chia-Shiung Tsai, Hsin-Chu (TW); Ru-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/157,599

(22) Filed: Jan. 17, 2014

(65) Prior Publication Data

US 2015/0137206 A1     May 21, 2015

Related U.S. Application Data

(60) Provisional application No. 61/904,989, filed on Nov. 15, 2013.

(51) Int. Cl.
| | |
|---|---|
| *H01L 21/3205* | (2006.01) |
| *H01L 29/788* | (2006.01) |
| *H01L 29/66* | (2006.01) |
| *H01L 29/423* | (2006.01) |
| *H01L 21/311* | (2006.01) |
| *H01L 29/06* | (2006.01) |
| *H01L 21/762* | (2006.01) |
| *H01L 21/306* | (2006.01) |
| *H01L 29/49* | (2006.01) |
| *H01L 21/3105* | (2006.01) |

(52) U.S. Cl.
CPC ........ *H01L 29/788* (2013.01); *H01L 21/30604* (2013.01); *H01L 21/31051* (2013.01); *H01L 21/31111* (2013.01); *H01L 21/76224* (2013.01); *H01L 29/0653* (2013.01); *H01L 29/42328* (2013.01); *H01L 29/4916* (2013.01); *H01L 29/66545* (2013.01); *H01L 29/66825* (2013.01)

(58) Field of Classification Search
CPC .................. H01L 21/28273; H01L 27/11521; H01L 27/115; H01L 29/66845; H01L 29/42324
USPC ........................... 438/587, 593; 257/315, 316
See application file for complete search history.

(56) References Cited

U.S. PATENT DOCUMENTS

| | | | |
|---|---|---|---|
| 7,928,491 B2 * | 4/2011 | Nakata et al. | ................. 257/314 |
| 2010/0065898 A1 | 3/2010 | Choi et al. | |

FOREIGN PATENT DOCUMENTS

| | | |
|---|---|---|
| KR | 1020010002886 | 1/2001 |
| KR | 1020100031854 | 3/2010 |

*Primary Examiner* — Quoc Hoang
(74) *Attorney, Agent, or Firm* — Slater & Matsil, L.L.P.

(57) ABSTRACT

A method includes forming a selection gate and a control gate for a flash memory cell in a memory device region. The selection gate and the control gate are over a semiconductor substrate. A protection layer is formed to cover the selection gate and the control gate. Stacked layers are formed in a logic device region, wherein the stacked layers extend to overlap the selection gate and the control gate. The stacked layers are patterned to form a gate stack for a logic device in the logic device region. After the patterning, an etching step is performed to etch a residue of the stacked layers in a boundary region of the memory device region. After the etching step, the protection layer is removed from the memory device region. Source and drain regions are formed for each of the flash memory cell and the logic device.

20 Claims, 9 Drawing Sheets

HK EMBODIED FLASH MEMORY AND METHODS OF FORMING THE SAME

PRIORITY CLAIM AND CROSS-REFERENCE

This application claims the benefit of the following provisionally filed U.S. patent application: Application Ser. No. 61/904,989, filed Nov. 15, 2013, and entitled "RRAM/MIM Structure and Methods of Manufacturing Same;" which application is hereby incorporated herein by reference.

BACKGROUND

Flash memories have become increasingly popular in recent years. A typical flash memory comprises a memory array having a large number of memory cells arranged in blocks. Some of the memory cells are fabricated as field-effect transistor having a selection gate and a storage layer. The storage layer is capable of holding charges and is separated from source and drain regions contained in a substrate by a layer of thin oxide. Each of the memory cells can be electrically charged by injecting electrons from the substrate through the oxide layer onto the storage layer. The charges can be removed from the storage layer by tunneling the electrons to the source region. The data in flash memory cells are thus determined by the presence or absence of charges in the storage layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "under," "below," "lower," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A flash memory embodying with logic Metal-Oxide-Semiconductor (MOS) device devices that comprise high-k metal stacks and the method of forming the same are provided in accordance with various exemplary embodiments. The intermediate stages of forming the flash memory and the logic devices are illustrated. The variations of the embodiments are discussed. Throughout the various views and illustrative embodiments, like reference numbers are used to designate like elements.

Figure 7:
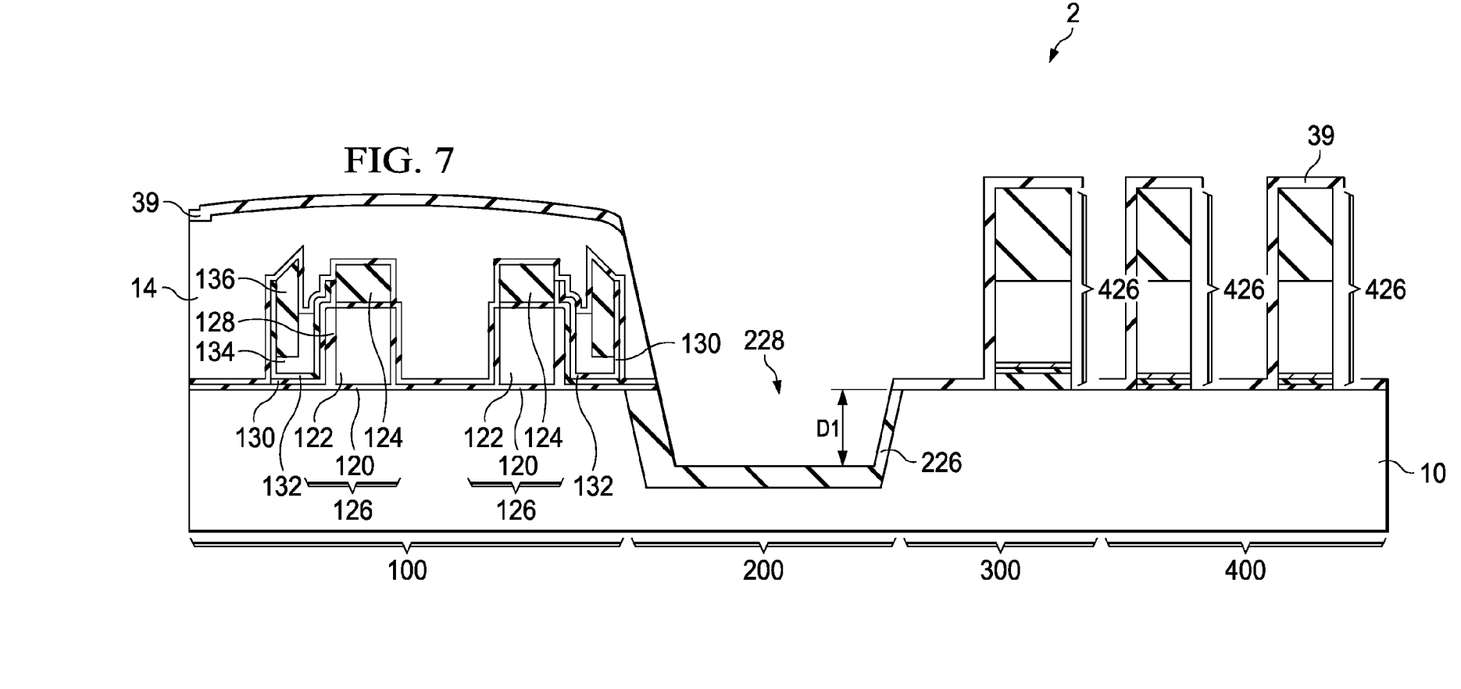
Figure 8:
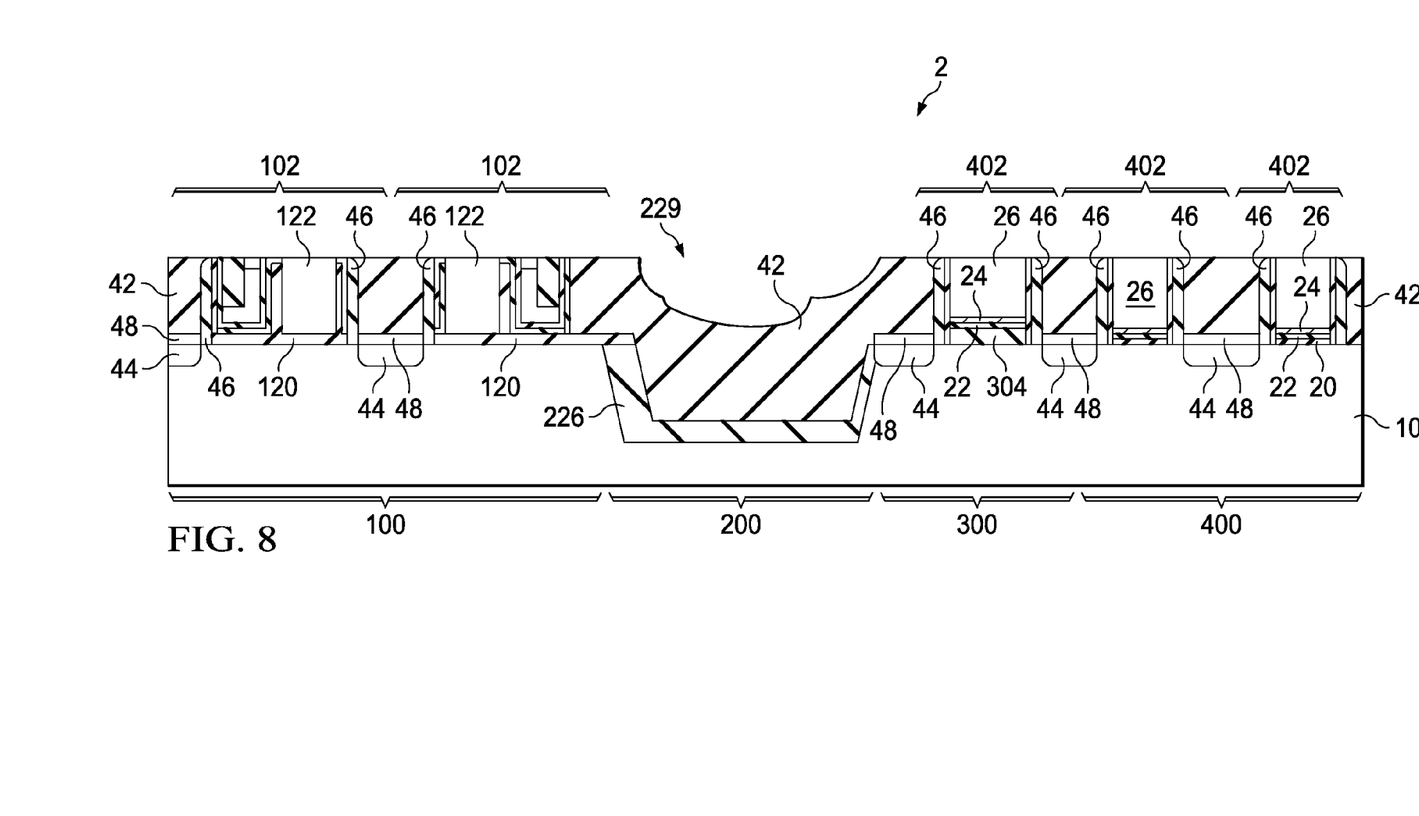
Figure 9:
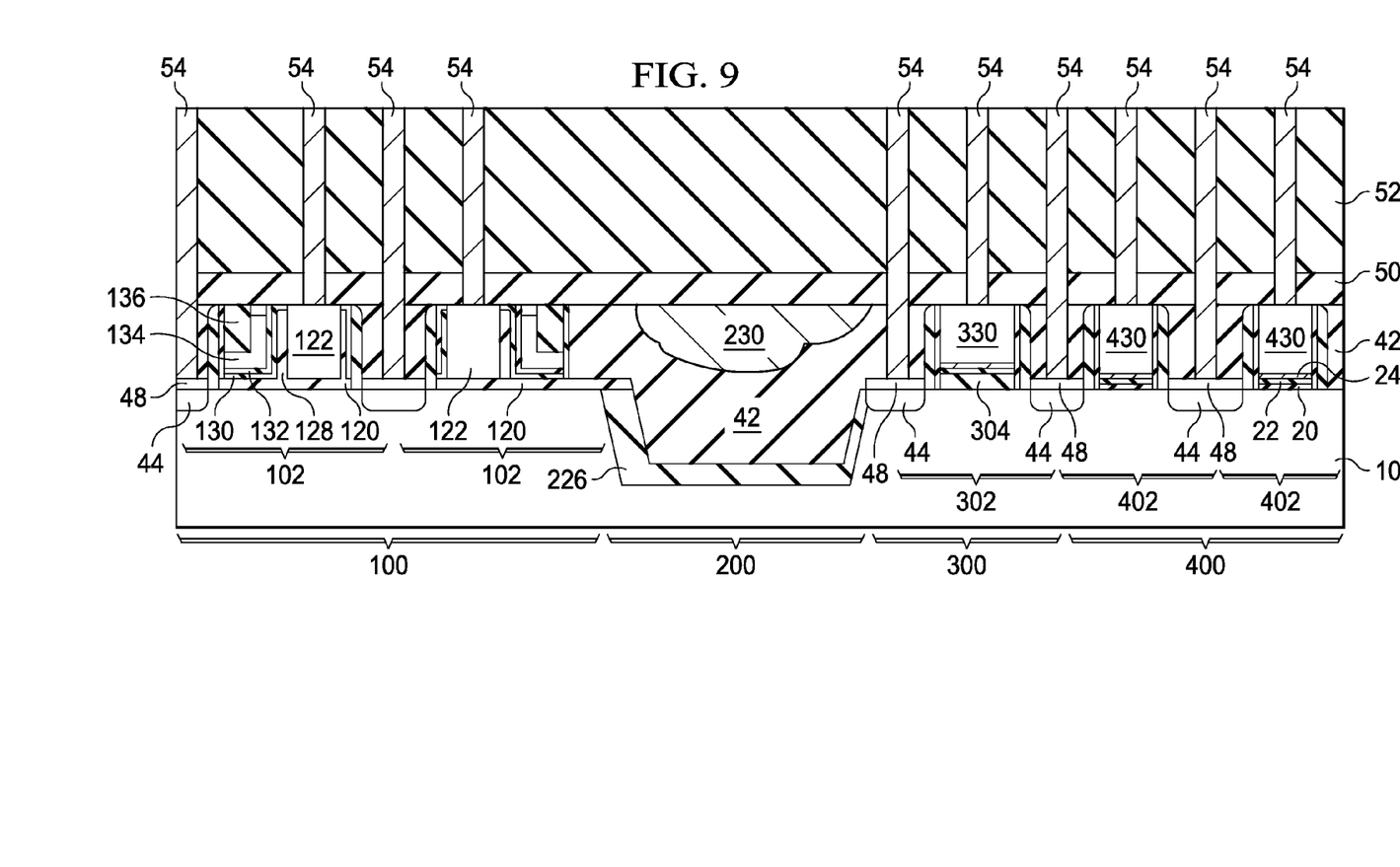

FIGS. 1 through 9 illustrate the cross-sectional views of intermediate stages in the formation of flash memory cells and logic Metal-Oxide-Semiconductor (MOS) devices in accordance with some embodiments. The final structure of the devices formed in accordance with embodiments of the present disclosure is illustrated in FIG. 9. FIG. 9 illustrates device regions 100, 200, 300, and 400. Device region 100 is a flash memory device region. Device region 200 is a boundary region of the flash memory devices. Device region 200 is close to, and is immediately neighboring, device region 100, with no other device regions between device regions 100 and 200. In device region 200, isolation region 226, which may be a Shallow Trench Isolation (STI) region, is resided. STI region 226 extends from the top surface of semiconductor substrate 10 to an intermediate level of semiconductor substrate 10.

Device regions 300 and 400 are logic device regions. For example, device region 300 is a High-Voltage (HV) device region. Device region 400 may be selected from an Input/output (IO) region, a Static Random Access Memory (SRAM) region, and a general logic (core) device region. Device region 100 is used for forming embedded flash memory cells 102 therein. HV region 300 is used for forming HV Metal-Oxide-Semiconductor (MOS) device 302 (FIG. 9) therein. Device region 400 is used for forming MOS devices 402 (FIG. 9) therein, wherein MOS devices 402 may include IO devices, core devices, SRAM MOS devices, and combinations thereof. HV MOS device 302 is supplied with, and is configured to endure, a positive power supply voltage higher than the positive power supply voltage of devices 402. For example, devices 402 may be supplied with a positive power supply voltage lower than about 1V, and device 302 may be supplied with a positive power supply voltage between about 1.5V and about 15V.

Figure 1:
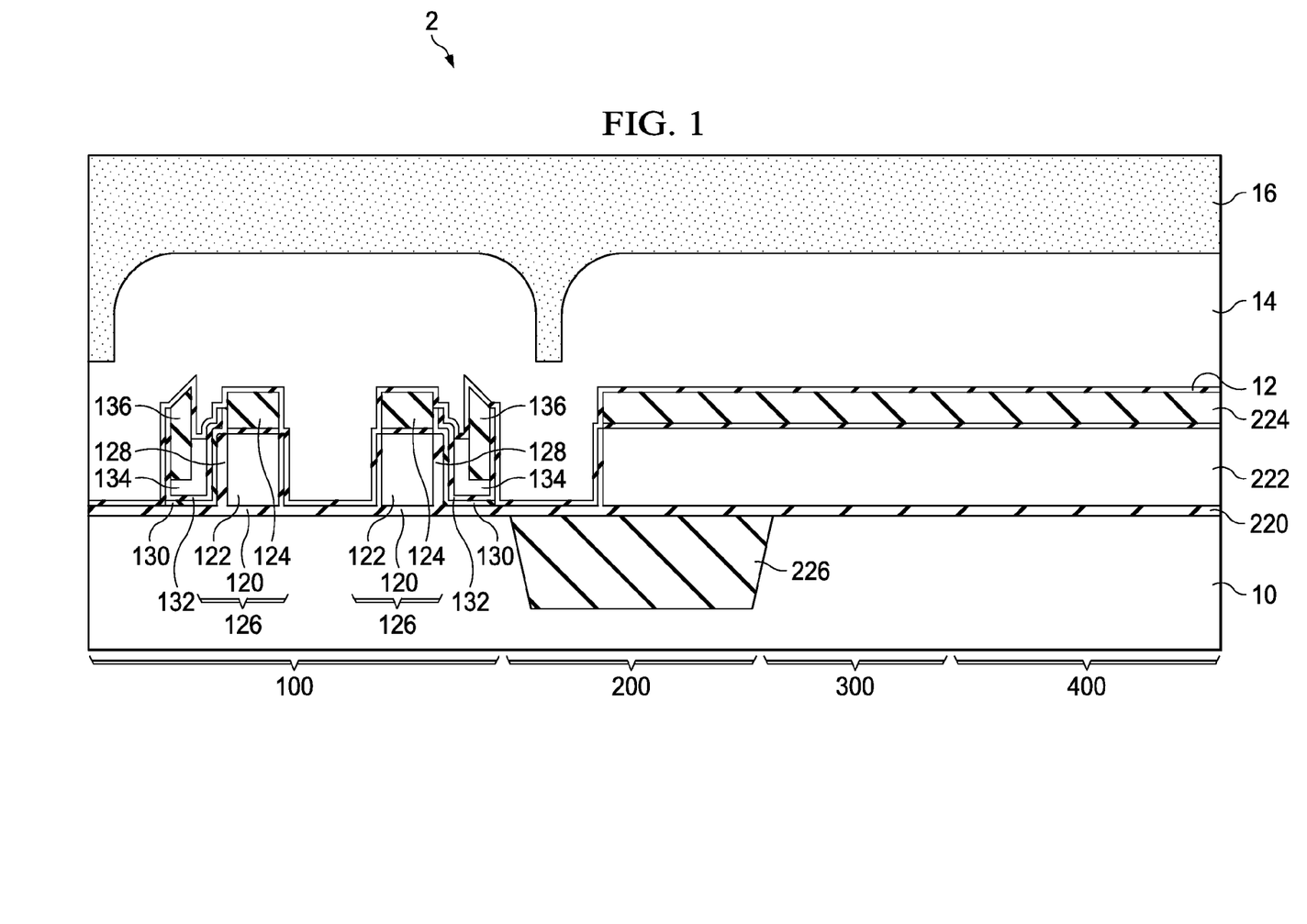
FIGS. 1 through 9 are cross-sectional views of intermediate stages in the formation of a flash memory cell and a logic Metal-Oxide-Semiconductor (MOS) device in accordance with some embodiments.

Referring to FIG. 1, an initial structure is formed first. The initial structure of wafer 2 includes semiconductor substrate 10, from which a plurality of devices including memory devices 102 and logic MOS devices 302 and 402 (FIG. 9) are to be formed.

In memory device region 100, gate stacks 126 are formed. Each of gate stacks 126 includes gate dielectric 120, selection gate (SG) 122 over gate dielectric 120, and hard mask 124 over selection gate 122. In some embodiments, gate dielectric 120 comprises an oxide such as silicon oxide. Other dielectrics such as nitrides, silicon nitrides, or multi-layers thereof may also be used. Selection gates 122 may be formed of polysilicon, for example, although other conductive materials may also be used. Hard mask 124 may include silicon nitride, for example. Alternatively, hard mask 124 may have a multi-layer structure including, for example, a Nitride-Oxide-Nitride (NON) structure.

Spacers 128 are formed on the sidewalls of selection gates 122. Storage layers 130, which may have an L-shape, are formed over dielectric layer 120 and on the sidewalls of spacers 128. Spacers 128 may be formed of oxides, nitrides, or other dielectric materials. Storage layers 130 are formed over dielectric layer 120, wherein storage layers 130 have an L-shape. In some embodiments, storage layers 130 are formed of a charge-trapping dielectric material such as silicon nitride or other dielectric materials including nano-islands. In alternative embodiments, storage layers 130 are formed of a conductive material such as polysilicon. Dielectric layers 132 are formed on the horizontal legs of storage layers 130.

Control gates 134 are formed on the sides of the respective selection gates. In some embodiments, control gates 134 are formed next to storage layers 130, and may sit on the horizontal legs of the respective dielectric layers 132. Control gates 134 may comprise polysilicon in some embodiments. Control gates 134 may have an L-shape in some embodiments. Furthermore, dielectric regions 136 are formed, and may sit on the horizontal legs of control gates 134.

In logic regions 300 and 400, dummy gate dielectric 220, dummy gates 222, and hard masks 224 are formed, which may be formed simultaneously when gate dielectrics 120, selection gates 122, and hard mask 124, respectively, are formed. Etch stop layer 12 is formed over hard masks 224, and covers the memory devices in device region 100. In some embodiments, etch stop layer is formed as a blanket layer, and extends into device regions 100, 200, 300, and 400. Etch stop layer 12 may comprise silicon nitride, for example. Protection layer 14 is formed over etch stop layer. Protection layer extends into device regions 100, 200, 300, and 400. In some embodiments, protection layer 14 is formed of amorphous silicon.

Next, Bottom Anti-Reflective Coating (BARC) 16 is formed. In some embodiments, BARC 16 comprises a carbon-containing material. It is observed that since no gate structures and dummy gate structures are formed in device region 200, the top surface of protection layer 14 is lower in device region 200, and protection layer 14 is recessed in device region 200. BARC 16 fills the recess, with the top surface of BARC 16 being more planar than the top surface of protection layer 14.

Figure 2:
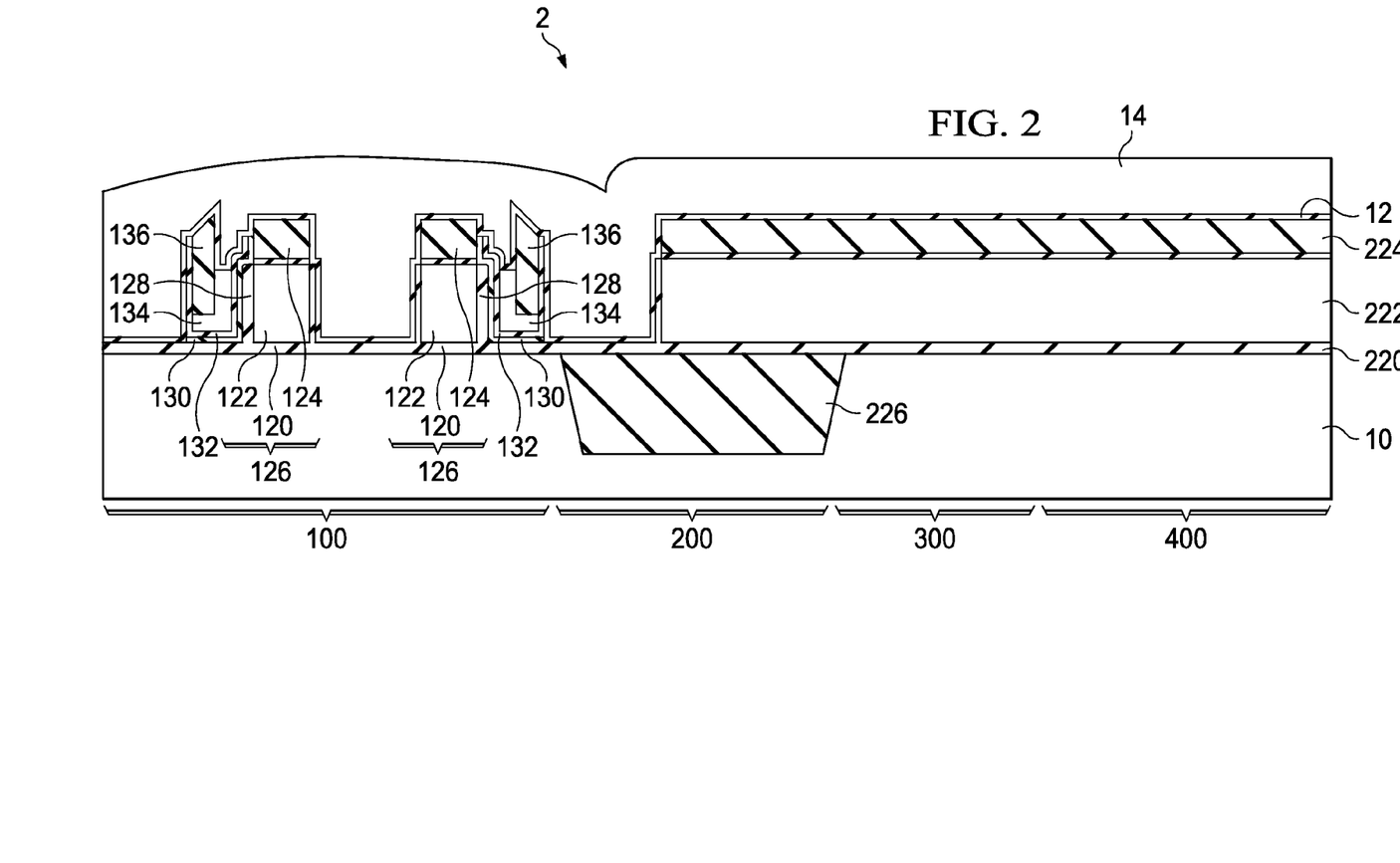

Next, referring to FIG. 2, BARC 16 and protection layer 14 are etched, until BARC 16 is removed and protection layer 14 is exposed. During the etching process, an etchant (an etchant solution or an etchant gas) that is able to etch BARC 16 and protection layer 14 with similar etching rates is used. As a result of the similar etching rates, the top surface of protection layer 14 is more planar than before the formation and the etching of BARC 16.

Figure 3:
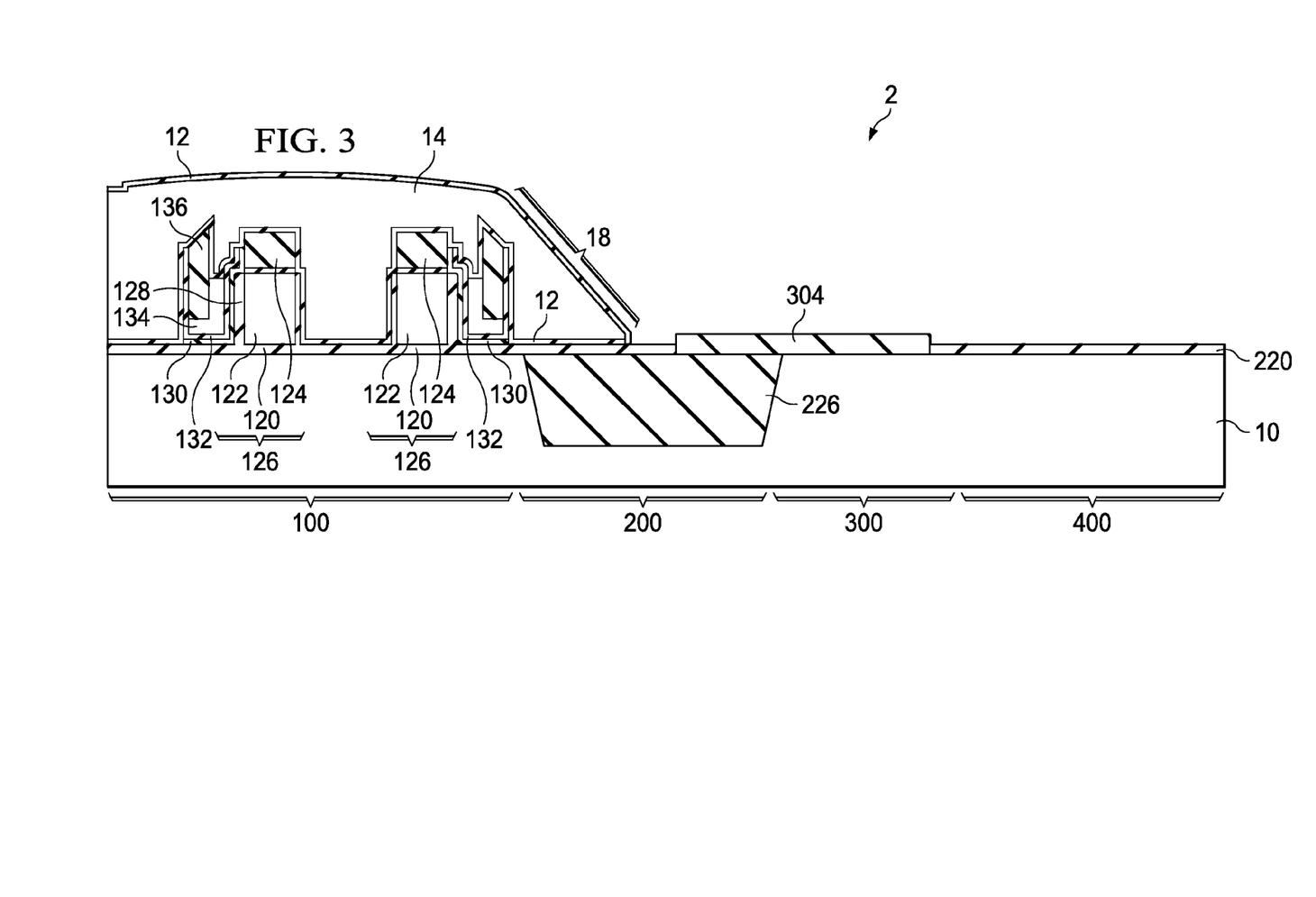

Next, referring to FIG. 3, the portions of protection layer 14 and etch stop layer 12 are removed from device regions 300 and 400. Also, dummy gate dielectric 220, dummy gates 222, and hard masks 224 are also removed. The removal process may include, for example, lithography processes and etching processes. The removal of protection layer 14 and etch stop layer 12 from device regions 300 and 400 results in the formation of slope 18 in device region 200, which is the boundary region of device region 100. The bottom tip of slope 18, and possibly an entirety of slope 18, is directly over STI region 226.

As also shown in FIG. 3, dielectric layer 304 is formed. Dielectric layer 304 is used to form the gate dielectric of HVMOS device 302 (FIG. 9), and hence is referred to as HV dielectric layer 304 hereinafter. Dielectric layer 304 may comprise an oxide such as silicon oxide, and may have a single-layer structure or a multi-layer structure.

Figure 4:
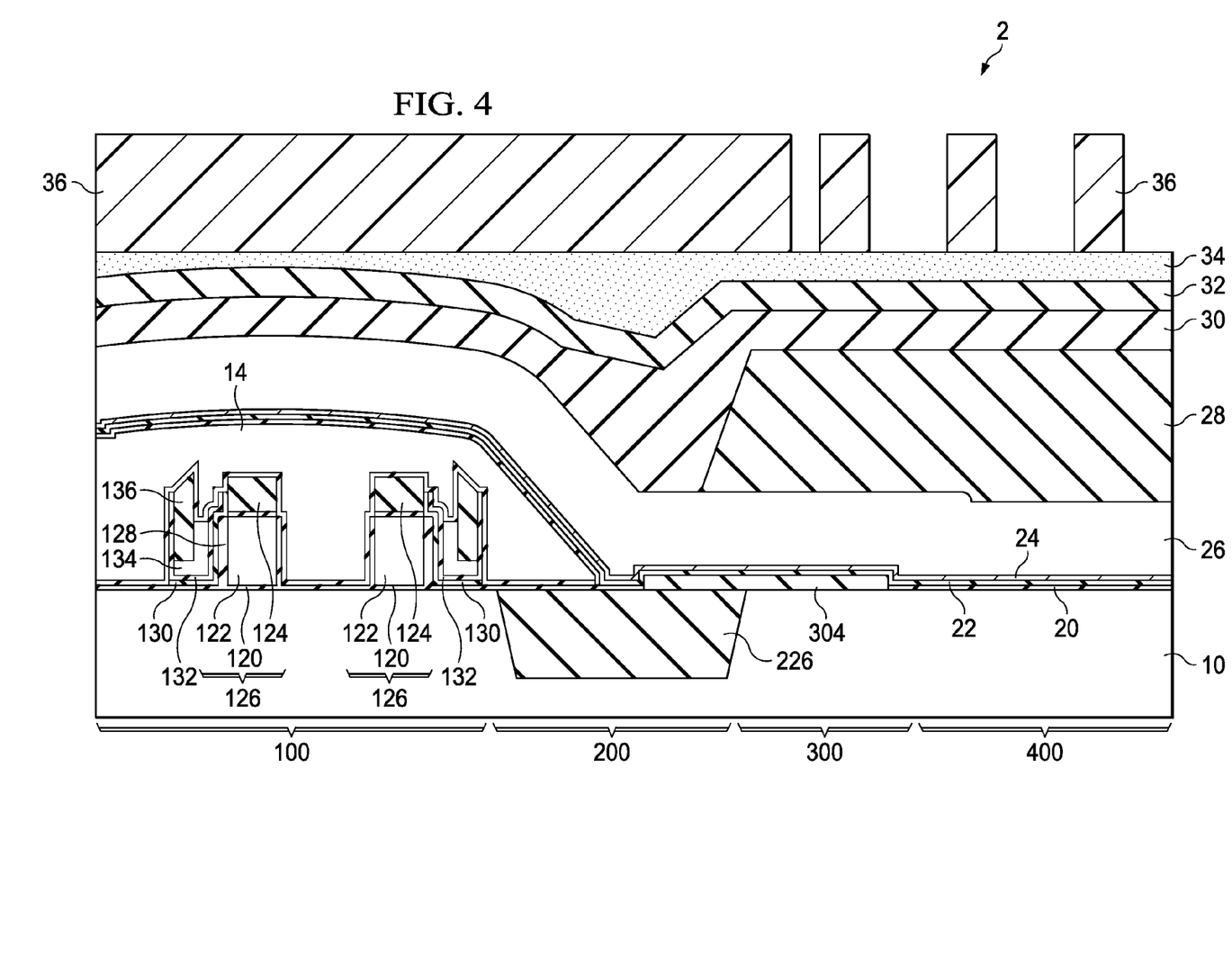

FIG. 4 illustrates the formation of the stacked layers that are used for forming gates in device regions 300 and 400. For example, the dummy oxide layer 220 (FIG. 3) may be removed, followed by the formation of interfacial oxide layer 20, high-k dielectric layer 22 over interfacial oxide layer 20, and conductive barrier layer 24 over high-k dielectric layer 22. In some exemplary embodiments, interfacial oxide layer 20 comprises silicon oxide. High-k dielectric layer 22 comprises a high-k dielectric material, which may be selected from hafnium oxide, aluminum oxide, lanthanum oxide, or the like. Conductive barrier layer 24 may comprise titanium, titanium nitride, tantalum, tantalum nitride, or the like.

Polysilicon layer 26 is formed over conductive barrier layer 24. Next, hard mask layer 28 is formed, and is then patterned, so that its remaining portions are in device regions 300 and 400, and do not extend into device region 100. Hard mask layer 28 may extend partially into device region 200. Hard mask layer 28 may comprise an oxide such as tetra-ethyl-ortho-silicate (TEOS) oxide. Over hard mask layer 28 is formed Ashing Removable Dielectric (ARD) 30. In some embodiments, ARD 30 is formed of amorphous carbon. Next, silicon oxynitride layer 32 and BARC 34 are formed. BARC 34 may comprise a carbon-containing material. Photo resist 36 is then formed over BARC 34, and is patterned.

Figure 5:
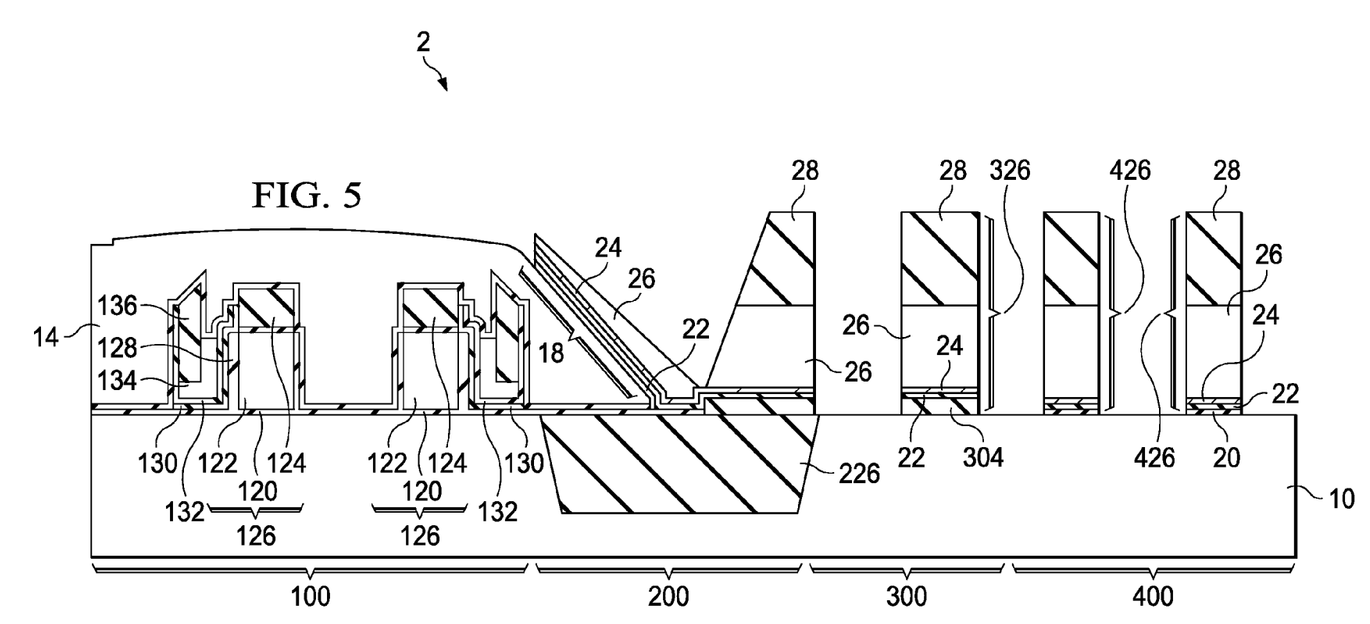

The illustrated layers 34, 32, and 30 are used to etch the underlying layers 28, 26, 24, 22, and 20, so that the patterns in photo resist 36 are transferred to the underlying layers. The resulting structure is shown in FIG. 5. Gate stacks 326 and 426 are formed, each including a portion of layers 28, 26, 24, 22, and 20. The remaining portions of polysilicon layer 26 form dummy gates. Accordingly, gate stacks 326 and 426 are also referred to as dummy gate stacks, although the remaining portions of layers 20, 22, and 24 are not dummy features. The overlying layers 34, 32, and 30, if not fully consumed during the formation of dummy gate stacks 326 and 426, are also removed subsequently.

As shown in FIG. 5, some remaining portions of high-k dielectric layer 22, conductive barrier layer 24, and possibly some residue of polysilicon layer 26 remain on slope 18. These residue layers may contaminate the subsequently formed devices on the wafer. Accordingly, a lithography step and an etching step are performed to remove the residue of high-k dielectric layer 22, conductive barrier layer 24, and polysilicon layer 26, as illustrated in FIGS. 6 and 7.

Figure 6:
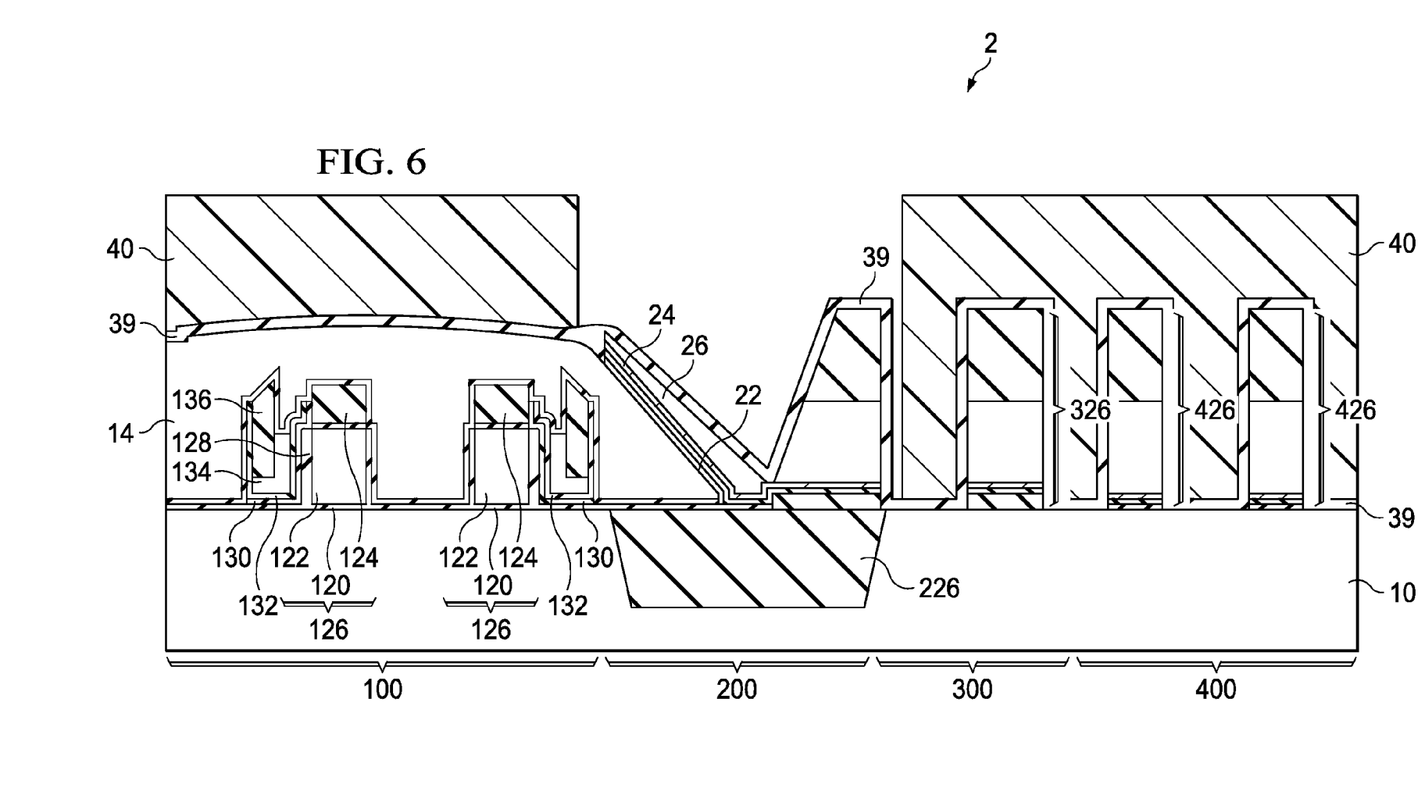

Referring to FIG. 6, seal layer 39 is formed to cover the structure in FIG. 5. Seal layer 39 may comprise silicon nitride, for example. Alternatively, oxides, oxynitride, silicon carbide, or the like, may also be used to form seal layer 39. Photo resist 40 is formed to cover device regions 100, 200, and 300, while a part of device region 200 is left un-covered. Slope 18 is thus not covered by photo resist 40.

FIG. 7 illustrates the etching step for etching the residue of high-k dielectric layer 22, conductive barrier layer 24, and polysilicon layer 26. The etchant used in the etching may include Cl2, BCl3, Ar, Fluorine-based chemistry, HF-based chemistry, NH4OH, the combination of NH4OH and H2O2, the combination of HCl and H2O2, the combination of H2SO4 and H2O2, or the like. The order and the combination of gases are selected according to the material in device region 200, so that the residue of high-k dielectric layer 22, conductive barrier layer 24, and polysilicon layer 26 are removed. The portion of seal layer 39 not covered by photo resist 40 is also etched. In addition, the portion of gate dielectric 120 not covered by photo resist 40 is also etched, In some embodiments, the etching results in STI region 226 to be etched, and recess 228 is formed. In some embodiments, recess 228 has depth D1 in the range between about 10 Å and about 1,500 Å. The portions of recess 228 in STI region 226 may be fully encircled by STI region 226. Furthermore, at least a portion of STI region 226 is underlying recess 228, and hence recess 228 does not penetrate through STI region 226.

Next, referring to FIG. 8, the remaining portions of flash memory cells 102, HVMOS device 302, and MOS device 402 are formed. An exemplary process flow is briefly described as follows. First, seal layer 39, protection layer 14, and hard masks 28 as shown in FIG. 7 are removed. Next, gate spacers 46, source/drain regions 44, and source/drain silicide regions 48 are formed in device regions 100, 300, and 400, wherein gate spacers 46, source/drain regions 44, and source/drain silicide regions 48 may be formed simultaneously in device regions 100, 300, and 400.

Next, Inter-Layer Dielectric (ILD) 42 is formed, followed by a planarization to planarize the top surfaces of selection gates 122, ILD 42, and dummy gate electrodes 26. The planarization may comprise a Chemical Mechanical Polish (CMP). Due to the recess 228 in FIG. 7, and also possibly due to the dishing effect in the CMP, recess 229 is formed in device region 200. Recess 229 extends from a top surface of ILD 42 to an intermediate level of ILD 42.

Next, dummy gates 26 in device region 300 and 400 are replaced by metal gates 330 and 430, respectively, as shown in FIG. 9. The exemplary process may include etching dummy gates 26, filling a metallic material into the recesses left by dummy gates 26, and performing a CMP to remove excess portions of the metallic material. The metal material may include a p-type metal (with a high work function higher than about 4.7 eV, for example), an n-type metal (with a low work function lower than about 4.3 eV, for example), or a mid-gap metal. Exemplary materials of the metallic material include TiN, TaN, TiAl, or alloys thereof.

At the same time the metallic material is filled into the recesses left by the removed dummy gates 26, the metallic material is also filled into recess 229 as shown in FIG. 8. As a result, as shown in FIG. 9, metal residue 230 is formed in ILD 42, and metal gates 330 and 430 are formed for HVMOS device 302 and logic MOS devices 402, respectively. In subsequent steps, etch stop layer 50 and ILD 52 (sometimes referred to as ILD2) are formed as blanket layers. Contact plugs 54 are then formed in etch stop layer 50 and ILD 52 to connect to the gates and the source/drain regions of flash memory cells 102, HVMOS device 302, and logic MOS device 402.

In the resulting structure, metal residue 230 and metal gates 330 and 430 are formed of a same metallic material. Metal residue 230 may have an irregular top-view shape, and a non-flat bottom surface. Furthermore, metal residue 230 may be electrical floating. The sidewalls and the bottom surface of metal residue 230 may be in contact with ILD 42, and the top surface, which is flat, may be in contact with the bottom surface of the overlying dielectric layer such as etch stop layer 50.

The embodiments of the present disclosure have some advantageous features. By incorporating a lithography process and an etching process to remove the residue of various layers from the boundary region of the flash memory device region, the contamination to other devices, which is caused by the residue, is eliminated.

In accordance with some embodiments of the present disclosure, a method includes forming a selection gate and a control gate for a flash memory cell in a memory device region. The selection gate and the main gate are over a semiconductor substrate. A protection layer is formed to cover the selection gate and the control gate. Stacked layers are formed in a logic device region, wherein the stacked layers extend to overlap the selection gate and the control gate. The stacked layers are patterned to form a gate stack for a logic device in the logic device region. After the patterning, an etching step is performed to etch a residue of the stacked layers in a boundary region of the memory device region. After the etching step, the protection layer is removed from the memory device region. Source and drain regions are formed for each of the flash memory cell and the logic device.

In accordance with some embodiments of the present disclosure, a method includes forming a selection gate and a control gate for a flash memory cell in a memory device region, forming a protection layer to cover the selection gate and the control gate, removing a portion of the protection layer from a logic device region, and forming stacked layers in the logic device region. The stacked layers are over a semiconductor substrate, and extend to overlap the selection gate and the control gate. The method further includes patterning the stacked layers to form a gate stack of a logic device in the logic device region, wherein the gate stack includes a high-k dielectric layer and a polysilicon layer over the high-k dielectric layer. After the step of patterning, a photo resist is formed to cover the selection gate, the control gate, and the gate stack of the logic device, wherein a boundary region of the memory device region is un-covered by the photo resist. An etching step is performed using the photo resist as an etching mask, wherein after the etching step, an STI region in the boundary region is exposed. After the etching step, remaining portions of the protection layer are removed. Source and drain regions for the flash memory cell and the logic device are then formed.

In accordance with some embodiments of the present disclosure, an integrated circuit structure includes a semiconductor substrate, which includes a first portion in a memory device region, a second portion in a boundary region of the memory device region, and a third portion in a logic device region. A flash memory cell includes a selection gate and a control gate over the first portion of the semiconductor substrate. An STI region is in the second portion of the semiconductor substrate. An ILD includes a portion extending into the STI region. A metal residue is in the ILD, wherein the metal residue overlaps the portion of the ILD that extends into the STI region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a selection gate and a control gate for a flash memory cell in a memory device region, wherein the selection gate and the control gate are over a semiconductor substrate;
   forming a protection layer to cover the selection gate and the control gate;
   forming stacked layers in a logic device region, wherein the stacked layers are over the semiconductor substrate, and wherein the stacked layers extend to overlap the selection gate and the control gate;
   patterning the stacked layers to form a gate stack for a logic device in the logic device region;
   after the patterning, performing an etching step to etch a residue of the stacked layers in a boundary region of the memory device region;

after the etching step, removing the protection layer from the memory device region; and forming source and drain regions for each of the flash memory cell and the logic device.

2. The method of claim 1, wherein after the patterning the stacked layers, the protection layer comprises a slope, and wherein the slope and a bottom tip of the protection layer overlaps a Shallow Trench Isolation (STI) region in the semiconductor substrate.

3. The method of claim 2, wherein after the etching step, the slope of the protection layer is removed.

4. The method of claim 2, wherein a recess is generated by the etching step, with the recess extending into the STI region.

5. The method of claim 1 further comprising:
   after forming the source and drain regions, forming an Inter-Layer Dielectric (ILD);
   planarizing a top surface of the ILD with a top surface of the selection gate, wherein a recess is generated in the ILD; and
   replacing a dummy gate of the gate stack of the logic device with a metallic material, wherein the metallic material is simultaneously filled into the recess in the ILD.

6. The method of claim 1, wherein the etching step is stopped after a Shallow Trench Isolation (STI) region in the semiconductor substrate is exposed.

7. The method of claim 1, wherein the etching step is stopped with the STI region being partially etched.

8. A method comprising:
   forming a selection gate and a control gate for a flash memory cell in a memory device region;
   forming a protection layer to cover the selection gate and the control gate;
   removing a portion of the protection layer from a logic device region;
   forming stacked layers in the logic device region, wherein the stacked layers are over a semiconductor substrate, and wherein the stacked layers extend to overlap the selection gate and the control gate;
   patterning the stacked layers to form a gate stack of a logic device in the logic device region, wherein the gate stack comprises a high-k dielectric layer and a polysilicon layer over the high-k dielectric layer;
   after the step of patterning, forming a photo resist to cover the selection gate, the control gate, and the gate stack of the logic device, wherein a boundary region of the memory device region is un-covered by the photo resist;
   performing an etching step using the photo resist as an etching mask, wherein after the etching step, a Shallow Trench Isolation (STI) region in the boundary region is exposed;
   after the etching step, removing remaining portions of the protection layer; and
   forming source and drain regions for the flash memory cell and the logic device.

9. The method of claim 8, wherein a recess is formed in the STI region by the etching step.

10. The method of claim 8, wherein in the etching step, a residue of the high-k dielectric layer and a residue of the polysilicon layer is etched from the boundary region.

11. The method of claim 8 further comprising:
    after forming the source and drain regions, forming an Inter-Layer Dielectric (ILD);
    planarizing a top surface of the ILD with a top surface of the selection gate, wherein an additional recess is generated in the ILD; and
    replacing the polysilicon layer in the gate stack of the logic device with a metallic material, wherein the metallic material is simultaneously filled into the additional recess in the ILD to form a metal residue, with the metal residue overlapping the STI region.

12. The method of claim 11 further comprising forming an etch stop layer over and contacting the metal residue.

13. The method of claim 12, wherein the metal residue is electrically floating.

14. The method of claim 11, wherein the gate stack further comprises a conductive barrier layer over the high-k dielectric layer, and wherein after the replacing, the metallic material that replaces the polysilicon layer is over and contacting the conductive barrier layer.

15. A method comprising:
    forming a selection gate and a control gate for a flash memory cell, wherein the selection gate and the control gate are over a semiconductor substrate;
    forming stacked layers overlying the semiconductor substrate;
    patterning the stacked layers to form a gate stack for a logic device;
    after the patterning, performing an etching step to remove a residue of the stacked layers, wherein a first recess is generated by the etching step, with the first recess extending into a Shallow Trench Isolation (STI) region in the semiconductor substrate;
    forming an Inter-Layer Dielectric (ILD) over the semiconductor substrate;
    planarizing a top surface of the ILD with a top surface of the selection gate, wherein a second recess is generated to extend from a top surface of the ILD into the ILD, with the second recess overlapping at least a portion of the first recess; and
    replacing a dummy gate of the gate stack of the logic device with a metallic material, wherein the metallic material is simultaneously filled into the second recess to form a metallic region.

16. The method of claim 15 further comprising:
    before the etching step, forming a protection layer to cover the selection gate and the control gate; and
    after the etching step, removing the protection layer.

17. The method of claim 16, wherein after the patterning the stacked layers, the protection layer comprises a slope, and wherein the slope overlaps a first portion of the STI region, with a second portion of the STI region not overlapped by the slope.

18. The method of claim 17, wherein the slope of the protection layer is removed by the etching step.

19. The method of claim 15, wherein the etching step is stopped before the STI region is etched through.

20. The method of claim 15 further comprising:
    forming an etch stop layer over and contacting the metallic region;
    forming an additional ILD over the etch stop layer; and
    forming contact plugs to penetrate through the additional ILD and the etch stop layer, wherein the contact plugs are electrically connected to the selection gate and the control gate, and wherein after the additional ILD and the contact plugs are formed, the metallic region is electrically floating.

* * * * *